Figure 1:
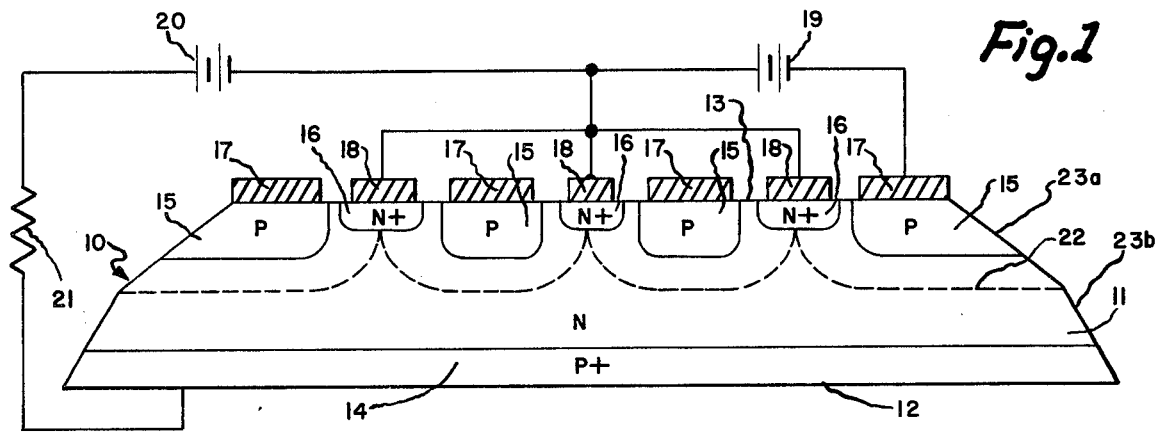

United States Patent [19]

Ferro

[11] 4,037,245
[45] July 19, 1977

[54] ELECTRIC FIELD CONTROLLED DIODE WITH A CURRENT CONTROLLING SURFACE GRID

[75] Inventor: Armand P. Ferro, Schenectady, N.Y.

[73] Assignee: General Electric Company, Schenectady, N.Y.

[21] Appl. No.: 636,070

[22] Filed: Nov. 28, 1975

[51] Int. Cl.² .................. H01L 29/00; H01L 29/74; H01L 29/80; H01L 29/747
[52] U.S. Cl. ................................ 357/38; 357/22; 357/37; 357/39; 357/86; 307/304
[58] Field of Search ............... 357/22, 29, 38, 39, 357/86, 37; 307/304

[56] References Cited

U.S. PATENT DOCUMENTS

| | | | |
|---|---|---|---|
| 3,465,216 | 9/1969 | Teszner | 357/22 |
| 3,808,515 | 4/1974 | Davis et al. | 357/22 |
| 3,855,609 | 12/1974 | Magdo et al. | 357/22 |
| 3,896,477 | 7/1975 | Hutson | 357/38 |
| 3,938,241 | 2/1976 | George et al. | 357/22 |
| 3,953,879 | 4/1976 | Arlach et al. | 357/22 |
| 3,982,264 | 9/1976 | Ishitani | 357/22 |

Primary Examiner—Andrew J. James
Attorney, Agent, or Firm—Jerome C. Squillaro; Joseph T. Cohen; Julius J. Zaskalicky

[57] ABSTRACT

An electric field controlled semiconductor diode comprises a semiconductor substrate with a uniform anode injecting region formed in one major surface of the substrate and a current controlling surface grid formed in the other major surface. The interstices of the grid include a cathode region of high injection efficiency. Means for controlling flow of electrical current between the anode and cathode regions is also described.

13 Claims, 4 Drawing Figures

ELECTRIC FIELD CONTROLLED DIODE WITH A CURRENT CONTROLLING SURFACE GRID

The present invention relates to semiconductor devices and more particularly to an electric field controlled diode in which current flow through the diode is controlled by an electric field applied to a surface grid.

Electric field controlled semiconductor devices such as field effect transistors, semiconductor controlled rectifiers, thyristors and charge transfer devices, are well known in the art. For example, the patents to Schockly, U.S. Pat. No. 2,744,970, and Dacey, U.S. Pat. No. 2,778,956, relate to field effect transistor devices in which the current flow through a semiconductor body is controlled by the application of an electric field generating voltage to a gate electrode located on the semiconductor body in a way to modulate current flow therethrough. Dacey, for example, includes a gate zone on the exterior sides of a semiconductor body having source and drain contacts at the ends thereof.

In the area of high power field controlled semiconductor devices, U.S. Pat. No. 3,025,438 to Wegener relates to a plurality of cylindrical semiconductor elements of one conductivity type surrounded by different conductivity type material. As described by Wegener, this is a majority carrier device with the field effect region created by the cylindrical regions arranged in rows and columns and joining opposed layers of similar conductivity type semiconductor material. The cylindrical elements are surrounded by a gate material of differing conductivity type with only contacts to the layers and gate region.

U.S. Pat. No. 3,227,896 to Teszner also discloses a power switching field effect transistor utilizing a grid surrounding opposite conductivity type channels for controlling current flow. To overcome apparent conduction limitations in the device, Teszner describes the use of a diode shunted by nonlinear resistance to provide sufficient minority carrier injection. The structure described as providing this function is a thin oxide layer covered by an opposite conductivity type semiconductor material piercing the oxide at selected locations. Unfortunately, such a structure does not sustain very high voltages nor is it very reproducible, and hence is unsatisfactory for most applications.

In U.S. Pat. No. 3,274,461, Teszner describes a bulk field effect device using majority carrier conduction. Teszner also appears to disclose a buried grid field terminated diode utilizing a diffused grid of P-type conductivity in an N-type substrate with an epitaxially grown layer of N-type conductivity overlying the P-type grid. While such buried grid structures may be adequate for certain applications, the inherently high resistance exhibited by the buried grid structure severely limits the power handling capability of the resulting device. Further, the use of an epitaxially grown layer over the P-type grid adds significantly to the complexity and cost of fabrication of such devices.

Accordingly, it is an object of this invention to provide a field controlled device which exhibits a low gate resistance characteristic and eliminates the costly epitaxial layer.

It is yet another object of this invention to provide a field controlled diode having a planar surface grid of low resistance and high injection efficiency electrodes.

It is another object of this invention to provide a gate turn-off capability by extraction of load current carriers through the grid contact preferably at low voltages and provide high power gain as compared to normal thyristor turnoff.

Another object is to provide a device which exhibits two carrier conduction as well as gate turn-off capability useful in power applications.

Briefly, in accordance with one preferred embodiment of the present invention, a field terminated diode structure comprises a semiconductor substrate with a uniform anode injecting region formed in one major surface of the substrate and a current controlling surface grid formed on the other major surface. The interstices of the surface grid include a cathode region of high injection efficiency for majority carriers while the anode region provides a highly efficient source of minority carriers. A metallized contact formed over the surface grid provides high lateral conductivity and hence a high current carrying capability for the grid structure. Metallized anode and cathode contacts formed over the anode and cathode respectively form similar high current carrying capability contacts.

Figure 2:
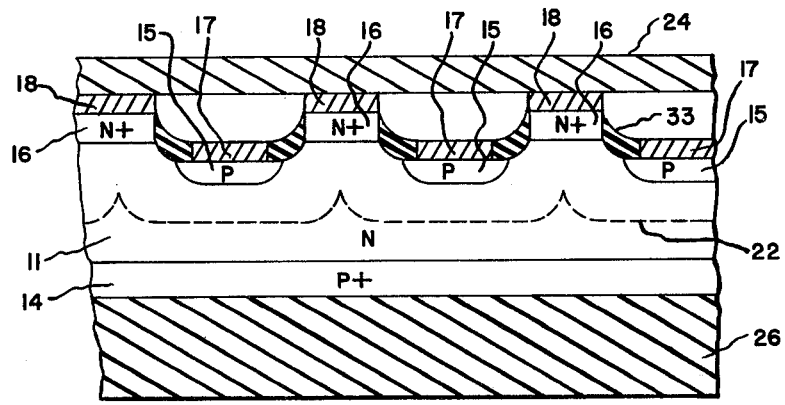
Figure 3:
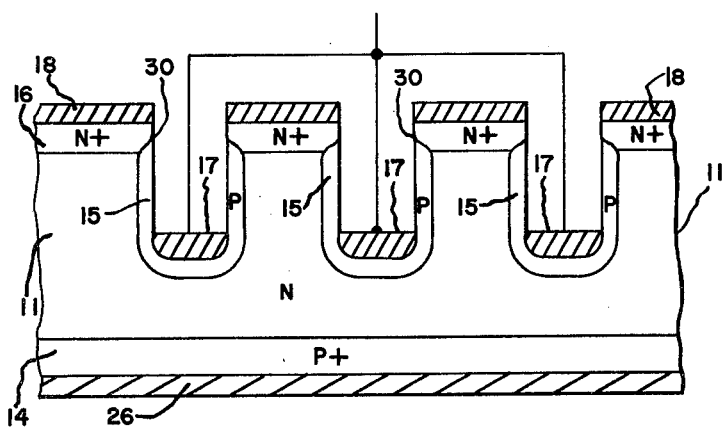
Figure 4:
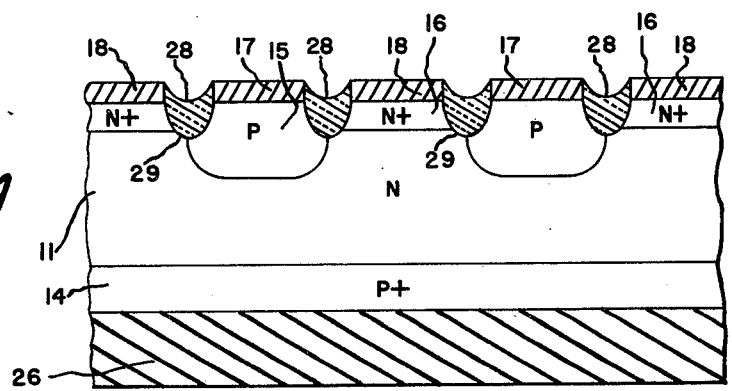

Other objects and advantages of the invention, along with a more complete description thereof are provided below in conjunction with the accompanying drawings in which:

FIG. 1 is a sectional view of a field terminated diode structure constructed in accordance with the present invention; and FIGS. 2, 3 and 4 are partial sectional views of alternative embodiments of a field terminated diode structure in accordance with my invention.

An embodiment of a field terminated diode structure constructed in accordance with the present invention is illustrated schematically in FIG. 1 and designated generally by the reference numeral 10. The field terminated diode structure 10 comprises a semiconductor substrate 11 of N-type conductivity, for example, and preferably of silicon semiconductor material. The substrate 11 includes two opposed major surfaces 12 and 13 with an anode region 14 of $P^+$-type conductivity formed in the surface 12. Advantageously, the anode region 14 is formed by diffusion of conductivity modifying impurities into the substrate. Alternatively, other techniques such as epitaxial growth or thermal gradient zone melting or ion implantation may be employed, if desired.

The surface 13 of the substrate is provided with a gate region 15 of P-type conductivity, formed by any of the aforementioned processes. The gate region 15 comprises an interconnecting grid structure with the spacing between the grid members selected in accordance with the desired diode characteristics in a manner more fully described below. The grid structure itself, however, may be of arbitrary design, such as a spiral configuration, a square or rectangular grid configuration, or any other desired arrangement.

Within the interstices defined by the interconnecting grid structure of the gate region 15 are a plurality of interconnecting cathode regions 16 of N-type conductivity, but having a higher impurity concentration than that of the substrate 11. The higher conductivity of the cathode regions 16 is designated by the $N^+$ notation in each region. As will become more apparent from the description below, the $N^+$-type cathode regions which are preferably formed by diffusion, facilitate electrical contact to these regions of the substrate and additionally increase the injection efficiency of majority carriers into the semiconductor substrate.

Since the field terminated diode illustrated in FIG. 1 is intended primarily for applications involving the control of large currents, i.e., in excess of 10 amperes to thousands of of amperes, it is desirable to provide low ohmic contacts to both the gate and cathode regions. Accordingly, by appropriate metallization, photolithographic masking and etching, gate and cathode electrode members 17 and 18 are formed over the gate and cathode regions 15 and 16, respectively. The metallization may be formed by any of the well-known techniques utilizing aluminum, molybdenum, or other high conductivity materials.

As illustrated in FIG. 1, the cathode regions 16 are connected together and to the positive terminal of a voltage source 19, the negative terminal of which is connected to the gate regions 15. Another voltage source 20 has its negative terminal connected to the positive terminal of the voltage source 19 and the positive terminal of the voltage source 20 is connected through a load impedance 21 to the anode 14. The function of the voltage source 19 is to provide a reverse bias voltage to the gate electrode 15, thereby causing the formation of a depletion region, the magnitude of which varies with the magnitude of the applied voltage from the source 19. The depletion region is illustrated in FIG. 1 by the dashed lines surrounding the gate 15 and is generally designated by the numeral 22. The voltage source 20, on the other hand, provides power to the load 21 in a manner controlled by the magnitude of the voltage source 19.

FIG. 1 also illustrates typical beveling 23a and 23b. As is well known, the negative bevel 23a assures high breakdown voltage when the anode is biased positive with respect to the cathode and the positive bevel 23b assures high breakdown voltage when the bias is reversed. Obviously, other techniques may be employed to improve the voltage breakdown characteristics, as desired.

Those skilled in the art can appreciate that the operation of the field terminated diode 10 can be generally characterized as a forwardly-biased diode (in the absence of a gate voltage from the voltage source 19) with the current flowing from the voltage source 20 through the load 21, to the anode region 14, through the body of the semiconductor substrate 11 and to the cathode region 16, and then back to the voltage source 20. In this mode of operation, the current flows from anode to cathode substantially unimpeded by any electric fields in the device. However, upon application of a gate voltage from the voltage source 19, such that a depletion region 22 forms around each gate region 15, current flow from anode to cathode is impeded by the presence of the depletion region. The larger the depletion region 22, the smaller the current flow from anode to cathode. Eventually, when the magnitude of the depletion region 22 of one gate region intersects the depletion region of the adjacent gate region, as illustrated in FIG. 1, current flow from anode to cathode is "pinched-off." The pinched-off condition in the field terminated diode structure described above is in some respects similar to that of a field effect transistor. More specifically, the magnitude of the voltage where adjacent depletion regions intersect is designated as the pinch-off voltage. When source 19 depletes the region between the P-grids, any further application of voltage from anode source 20 serves to further enhance this initially depleted region.

The embodiment of my invention illustrated in FIG. 1 is particularly useful as a current controlling device for d-c circuit applications, particularly those involving the control of tens to thousands of amperes. In such applications, the highly efficient minority carrier injection achieved by the $P^+$-type anode region 15 provides improved current carrying capabilities essential for high power applications. Similarly, the $N^+$-type cathode region 16 provides an improved source of majority carriers and facilitates ohmic contact to the lightly doped N-region 13. Additionally, the metallized regions overlying the cathode and grid regions further reduce ohmic losses at the interface of the semiconductor substrate and the electrical connections thereto. Those skilled in the art can readily appreciate that at high current densities, low ohmic contacts to the semiconductor substrates are essential to efficient device operation, reduced voltage drop and hence lower power losses in the device itself.

Those skilled in the art can also readily appreciate that field terminated devices of the type described herein are particularly useful in providing current control of tens to thousands of amperes merely by the application of a depletion region forming voltage to the reverse biased diode comprising the P-type region 15 and the N-type substrate 11. Obviously, a reverse biased diode, below its breakdown voltage, has negligibly small current flow therethrough and hence control of large currents between anode and cathode is possible with minimal power requirements at the gate electrode. Those skilled in the art can also appreciate that the magnitude of the voltage required to produce the pinched-off condition is a function of the spacing between the gate regions 15. The larger the spacing therebetween, the higher the voltage required to cause the depletion regions to intersect and hence produce the pinched-off condition. While on the one hand it is desirable to produce a device having low voltage requirements on the gate electrode, it is obvious that such a requirement necessitates relatively close spacing between the gate regions 15. However, since the current flowing between anode 14 and cathode 16 must flow in the interstices of the grid structure defining the gate region, a close spacing of the grid structure reduces the area available for current flow and hence the total current carrying capability of the device. Accordingly, the magnitude of the voltage necessary to produce pinch-off (as determined by the spacing between the P-type grid regions) is a compromise between the current carrying capability of the device and the voltage requirements at the gate electrode.

A particularly desirable characteristic of this invention is the ability of the device to provide rapid interruption of the current flow from anode to cathode by controlling the gate electrode potential. For example, when the device of FIG. 1 is conducting current from anode to cathode through the load 21, the gate bias voltage is zero volts. However, when it is desired to interrupt this current flow, a negative potential is applied to the gate electrode, causing the gate region 15 to be flooded with minority carriers. When this happens (generally only nanoseconds), the P-N junction formed between the P-type gate region and the N-type substrate region initially begins to conduct the load current, but soon becomes depleted of majority carriers and the junction becomes reverse-biased. Attendant with the reverse-bias is the formation of the depletion region 22 which causes pinch off to occur, thereby interrupting current flow from anode to cathode. This mode of operation is referred to as gate current extraction turn-off. Typically, in this mode of operation, a 15 ampere anode to cathode current is interrupted in only 300 nanoseconds, as compared to several hundred microseconds for a typical silicon controlled rectifier. One advantage of the gate current extraction turn-off mode of operation is that turn-off is achieved at substantially lower voltage than normal thyristors, for example. As a result, high power gain is achieved as compared to normal thyristor turn-off. Those skilled in the art can appreciate that, if desired, the device may also be operated in the normal anode current commutation mode as is typical of most thyristor devices.

In the embodiments of my invention illustrated in FIGS. 2, 3 and 4, alternative means are illustrated for maintaining high current carrying capability while minimizing the requirements of the gate voltage. Basically, FIG. 2 illustrates a field terminated diode structure (wherein like referenced numerals are utilized) in which the gate region 15 is depressed below the surface 13 of the substrate. In this embodiment of my invention, the P-type gate region 15 may, for example, be formed by diffusion into the semiconductor substrate after selective etching of the substrate surface through a previously formed uniform region of $N^+$-type conductivity. Alternatively, the P-type gate region may be diffused prior to selective etching of the grid-like structure. The depressed gate region obtained in both cases is advantageously metallized over its entire surface, retaining the low resistance gate while allowing conventional planar contact 24 to the cathode electrode 18. The regions 33 between cathode and gate metal contacts is also advantageously covered with a passivating dielectric material such as silicon dioxide, for example.

FIG. 2 illustrates two particularly desirable characteristics for high current controlling devices; namely, a more uniform depletion region surrounding the $N^+$-type cathode region 16 to provide reliable current control and, secondly, the ability to provide double-sided cooling of the substrate. More specifically, FIG. 2 illustrates conductive members 24 and 26 in low ohmic and thermal contact with the anode and cathode electrodes 14 and 18, respectively. These conductive members 24 and 26 may be utilized as both electrical current carrying conductors and as thermal heat sinks for the current controlling device. The use of such conductive members substantially improves the power handling capability of these devices.

FIG. 3 illustrates yet another embodiment of my invention wherein the P-type gate region is formed in grooves or holes formed in the substrate, the shape of which is determined by the desired device characteristics, starting material orientation and resistivity. This embodiment provides pinch-off at lower voltages than the embodiment of FIGS. 1 and 2. For example, designs fabricated with holes having aspect ratios of 10 to 1 exhibit pinch-off voltages on the order of a few volts. As illustrated in FIG. 3, the P-type gate region 15 is significantly depressed below the planar surface of the substrate. In general, the depth and spacing of the grooves or holes is selected to provide the desired minimum gate pinch-off voltage without causing premature field avalanche due to junction 30 breakdown. By virtue of the depressed gate region, more uniform control of the depletion region surrounding the P-type gate is provided and at the same time insuring that the pinch-off condition is maintained without significant increases in gate potential source 19 even when a high voltage is applied between anode and cathode regions. This characteristic is particularly significant since it is otherwise impossible to stop current flow through the device.

There are many ways in which the embodiment illustrated in FIG. 3 can be fabricated. One method, for example, includes the uniform $N^+$ diffusion over the entire surface 13. Selective etching of holes, then P-type diffusion on surface 12 and over the entire cathode region. The surface concentration of the P-type dopant is selected to be insufficient to convert the $N^+$ regions but sufficient to convert the N-type substrate region adjacent the holes to P-type. This is illustrated by gate region 15 in FIG. 3. If subsequent avalanche breakdown of the P-type region to the $N^+$-type cathode regions is greater than the pinch-off voltage, normal device operation results. If, however, the gate-cathode voltage avalanche voltage is less, the simple etching of the regions 30 after metallization will increase this voltage to an acceptable level. Contact to the P-gate region 15 can be achieved as shown in FIG. 3, or the deeply etched region can be filled by reactor deposition of highly conductive metals or polysilicon films to facilitate ohmic contact to the electrical circuit.

FIG. 4 illustrates yet another embodiment of my invention wherein selective etching between the gate and cathode regions is utilized to provide isolation therebetween while simplifying fabrication. For example, the device illustrated in FIG. 4 may be fabricated by selective P-type diffusion into substrate 13 and the selective $N^+$-type diffusion such that the curved portions thereof intersect or touch. The low breakdown intersection region is then etched away and refilled with a dielectric passivation 28. It should be noted that the dielectric passivation 28 provided between the gate region 15 and cathode region 16 permits maximum contact area to the gate and cathode regions, thereby minimizing the series resistance. Additionally, the etched region 29 not only enhances breakdown voltage between regions 15 and the surface 13, but also reduces the effects of curvature.

In summary, I have disclosed a novel semiconductor current controlling device in the form of a field terminated diode in which current control of tens to thousands of amperes is achieved with a device utilizing a voltage control electrode with minimal current requirements as the control electrode and which exhibits the capability for gate turn-off by momentary extraction of the load current through the low impedance gate structure. Alternative embodiments of my invention illustrate desirable configurations for improving current control capability, minimizing power losses in the device, and improved thermal conduction.

It will be apparent to those skilled in the art that various modifications may be made within the spirit and scope of the invention. Accordingly, the appended claims are intended to cover all such modifications and variations.

What I claim as new is:

1. A three-electrode semiconductor current controlling device comprising:
   a semiconductor substrate of N-type conductivity, said substrate having opposed major surfaces;
   an anode region of P-type conductivity formed in one major surface;
   a plurality of gate regions of P-type conductivity formed in the other major surface, said gate regions comprising an interconnecting grid structure of P-type conductivity;

a plurality of interconnecting cathode regions of N-type conductivity of higher impurity concentration than said substrate, each of said cathod regions formed in said other major surface and in the interstices defined by said interconnecting grid structure;

anode, gate and cathode electrodes respectively overlying said anode, gate and cathode regions and making low ohmic contact therewith; and means for controlling the flow of electrical current between said anode and cathode electrodes, said means including the formation of depletion regions in said substrate around each gate region, the intersection of adjacent depletion regions causing the termination of current flow between said anode and cathode electrodes.

2. The device of claim 1 wherein the spacing of the grid structure for said gate regions is nominally twice the depletion layer width at a selected pinch-off voltage.

3. The device of claim 1 wherein said grid structure is recessed below the plane of said other major surface.

4. The device of claim 3 wherein said grid structure further includes a passivating layer separating said gate and cathode regions.

5. The device of claim 1 wherein said means for controlling the flow of electrical current includes means for applying bias voltages to said electrodes.

6. The device of claim 1 further comprising means for cooling said device.

7. The device of claim 6 wherein said cooling means includes conductive means in thermal contact with at least one of said major surfaces.

8. The device of claim 1 wherein said means for controlling the flow of electrical current includes means for applying a bias voltage to said gate electrode.

9. An electric field controlled diode comprising:

a semiconductor substrate of one conductivity type with opposed major surfaces, one of said surfaces being of opposite conductivity type and the other of said surfaces having a plurality of interconnecting gate regions of opposite conductivity type;

a plurality of interconnected regions of higher conductivity type than said substrate formed in said other surface and within the interstices of said gate regions; and means for controlling the flow of current between said surface of opposite conductivity type and said plurality of interconnected regions, said means including the formation of depletion regions in said substrate around said gate regions by the application of a bias voltage between said gate regions and said regions of higher conductivity type whereby the intersection of adjacent depletion regions causes the termination of current flow between said surface of opposite conductivity type and said plurality of interconnected regions of higher conductivity type.

10. The diode of claim 9 further comprising means forming low ohmic contacts to said surface of opposite conductivity type, said plurality of gate regions and said plurality of interconnected regions.

11. The diode of claim 10 wherein said plurality of gate regions are recessed below the surface of said substrate.

12. The diode of claim 11 further comprising means for cooling said substrate.

13. The diode of claim 12 wherein said substrate is of N-type conductivity and said one surface and said gate regions are of P-type conductivity.

* * * * *